United States Patent
Jang

(10) Patent No.: US 6,483,068 B2
(45) Date of Patent: Nov. 19, 2002

(54) APPARATUS FOR HARD BAKING PHOTORESIST PATTERN

(75) Inventor: Se-Jin Jang, Choongcheongbuk-Do (KR)

(73) Assignee: Hyundai Electronics Industries Co., Ltd., Kyoungki-Do (KR)

(*) Notice: Subject to any disclaimer, the term of this patent is extended or adjusted under 35 U.S.C. 154(b) by 0 days.

(21) Appl. No.: 09/767,260

(22) Filed: Jan. 23, 2001

(65) Prior Publication Data

US 2002/0030046 A1 Mar. 14, 2002

(30) Foreign Application Priority Data

Aug. 16, 2000 (KR) .............................. 00-47186

(51) Int. Cl.$^7$ .............................................. F27D 11/00
(52) U.S. Cl. ................... 219/39 D; 219/441.1; 392/416; 392/418; 118/724; 118/50.1
(58) Field of Search ................ 219/39 D, 405, 219/411, 444.1; 392/416, 418; 118/724, 725, 50.1; 250/492.2, 492.22

(56) References Cited

U.S. PATENT DOCUMENTS

| | | | | |
|---|---|---|---|---|
| 4,755,654 A | * | 7/1988 | Crowley et al. | 219/405 |
| 5,587,019 A | * | 12/1996 | Fujie | 118/725 |
| 5,849,582 A | * | 12/1998 | Chen et al. | 430/328 |
| 6,138,745 A | * | 10/2000 | Moslehi | 165/80.1 |
| 6,222,609 B1 | * | 4/2001 | Nishimura | 355/30 |

\* cited by examiner

*Primary Examiner*—Joseph Pelham
*Assistant Examiner*—Shawntina T. Fuqua
(74) *Attorney, Agent, or Firm*—Morgan, Lewis & Bockius LLP

(57) ABSTRACT

A hard baking apparatus which is capable of evenly heating a semiconductor substrate when a photoresist pattern of the semiconductor substrate is hard baked. The apparatus for hard baking a photoresist pattern including: a chamber; a chuck installed at a lower portion in the chamber on which a semiconductor substrate is mounted; a heating unit installed at an upper portion in the chamber; and a unit installed at a lower portion of the heating unit for evenly distributing light.

4 Claims, 2 Drawing Sheets

APPARATUS FOR HARD BAKING PHOTORESIST PATTERN

This application claims the benefit of Korean Application No. 47186/2000 filed Aug. 16, 2000, which is hereby incorporated by reference.

BACKGROUND OF THE INVENTION

1. Field of the Invention

The present invention relates to a method for fabricating a semiconductor device and more particularly to an apparatus for hard baking a photoresist pattern employed as an etching mask in an etching process.

2. Description of the Background Art

As semiconductor devices become more integrated, their pattern width become narrow and fine. Accordingly, a contact hole for connecting wiring patterns of an upper and a lower layers becomes very small, making it difficult to fabricate an etching mask for forming a contact hole with a precise size. The reasons for this are set forth in detail hereinbelow.

In the process of fabricating a semiconductor, a photoresist pattern is typically employed as an etching mask formed by exposing and developing a photoresist film.

However, there is a critical dimension determined for resolution with the currently used light source and exposing equipment. Thus, in case that the size of a contact hole reaches the critical dimension or is smaller than the critical dimension, it is not possible to fabricate a photoresist pattern (an etching mask) having an opening with an accurate contact hole size by using photolithography.

Therefore, in order to form a contact hole having the same or a smaller size than the resolution critical dimension, a method has been employed in which a photoresist pattern having an opening larger than a contact hole is fabricated, and a photoresist film is flown in a hard bake process, reducing the size of the opening.

In other words, in the conventional hard bake process, the photoresist film was heated to a degree of puddling, so that the photoresist film was not flown.

However, lately, there has been adopted a method in which, in the process of forming a pattern of photoresist film, such a flowing is more or less allowed in the hard bake process to reduce the size of the opening of the photoresist pattern.

The method for fabricating a photoresist pattern will now be described with reference to the accompanying drawings.

FIGS. 1A and 1B illustrate a series of processes of a method for fabricating a photoresist pattern by using an apparatus for hard baking a photoresist pattern in accordance with a conventional art.

As shown in FIG. 1A, a semiconductor substrate 10 is mounted on a chuck 1, and a conductive layer 11 is formed on the semiconductor substrate 10.

Next, an insulation layer 12 is formed on the upper surface of the conductive layer 11. And then, after a photoresist film is formed on the insulation layer 12, for which a soft bake, exposing and developing process are conducted, thereby forming a photoresist pattern 13 having an opening 14.

The size 'L1' of the opening 14 is formed larger than the size 'L2' of a contact hole desired to be actually formed on the insulation layer 12.

A temperature-sensing unit 2 is installed in the chuck 1 and a coil 3, a heating unit, is installed at the bottom surface of the chuck 1.

Next, a hard bake process is conducted by using the heating unit 3 to indirectly heat the semiconductor substrate 10 through the chuck 1.

During the hard bake process, the temperature of the heating unit and a heating time are set to allow some flowing. As shown in FIG. 1B, the opening 14 of the photoresist pattern 13 has the same size as the size 'L2' of the contact hole to be formed on the insulation layer.

If the temperature for heating the semiconductor during the hard bake process were higher than a pre-set temperature, the flowing would progress quickly, making the opening smaller than the originally intended size. Thus, the heating temperature of the semiconductor substrate and the heating time should be accurately and sensibly controlled.

However, the above-described hard bake process has the following problems.

Since the semiconductor substrate is indirectly heated through the chuck, its reaction speed is slow, making it difficult to accurately control the temperature for heating the semiconductor substrate.

In other words, a quick temperature control reaction speed is required to accurately form the opening with a desired size. Namely, if the reaction speed were too slow, too much flowing would occur, resulting in an opening of the photoresist pattern smaller than a desired size.

In addition, the semiconductor substrate heating method using the chuck is disadvantageous because it consumes a great amount of power due to the indirect heating of the semiconductor substrate.

Another problem is that temperature between the central portion and the marginal portion of the semiconductor substrate is not uniform. Thus, uniformity of the contact mask at the central portion and at the marginal portion of the semiconductor substrate is degraded.

SUMMARY OF THE INVENTION

Therefore, an object of the present invention is to provide a hard baking apparatus which is capable of evenly heating a semiconductor substrate when a photoresist pattern of the semiconductor substrate is hard baked.

Another object of the present invention is to provide an hard baking apparatus which has an excellent temperature control reaction characteristic for a photoresist pattern.

To achieve these and other advantages and in accordance with the purpose of the present invention, as embodied and broadly described herein, there is provided an apparatus for hard baking a photoresist pattern including: a chamber; a chuck installed at a lower portion in the chamber on which a semiconductor substrate is mounted; a heating unit installed at an upper portion in the chamber; and a unit installed at a lower portion of the heating unit for evenly distributing light.

In the apparatus for hard baking a photoresist pattern of the present invention, the heating unit refers to an infrared-ray lamp.

In the apparatus for hard baking a photoresist pattern of the present invention, the unit for evenly distributing light refers to a fly eye lens.

In the apparatus for hard baking a photoresist pattern of the present invention, a temperature-sensing unit is additionally installed in the unit for evenly distributing light.

In the apparatus for hard baking a photoresist pattern of the present invention, a cooling unit is installed at the bottom surface of the chuck.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
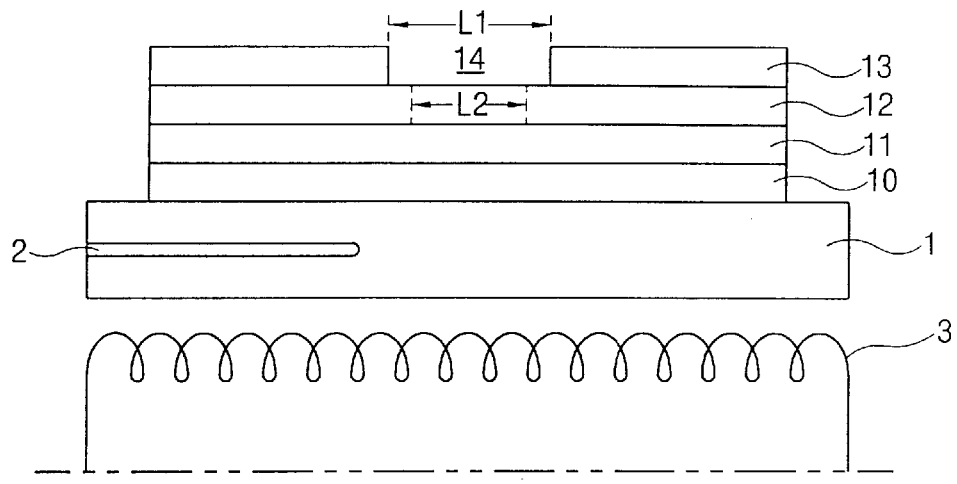
FIGS. 1A and 1B illustrate processes of method for fabricating a photoresist pattern by using an apparatus for hard baking a photoresist pattern in accordance with a conventional art.
Figure 1B:
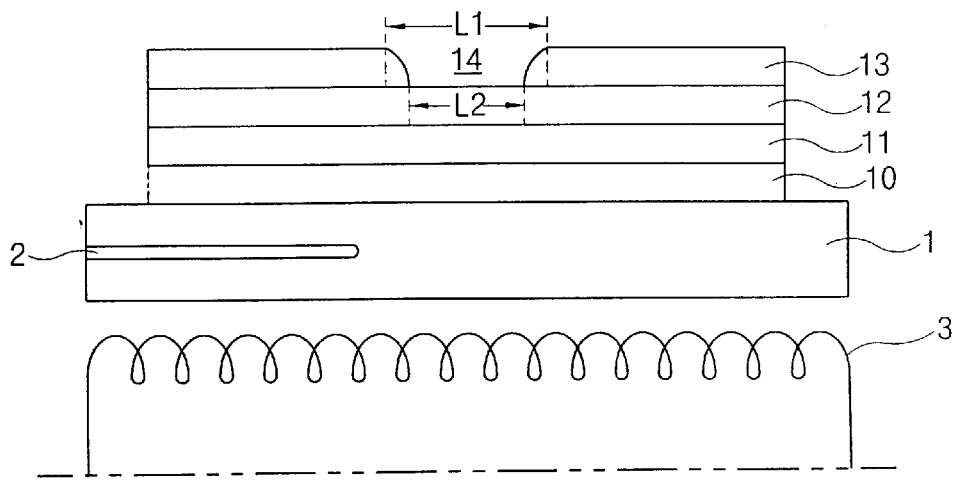
Figure 2:
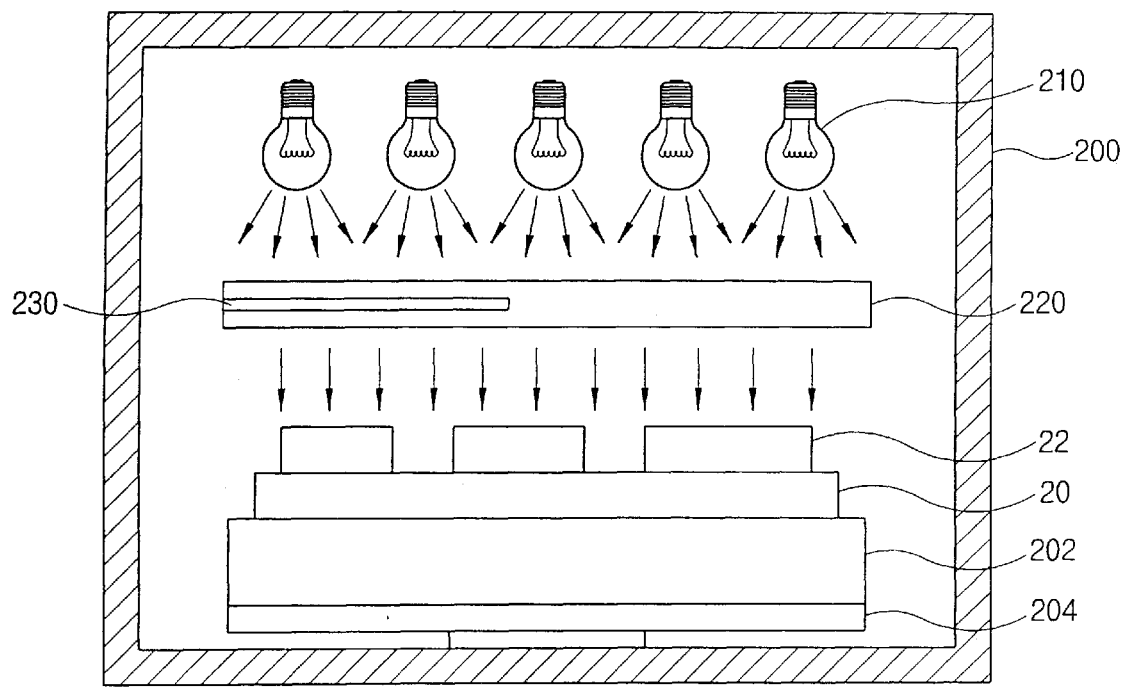
FIG. 2 is a schematic view of an apparatus for hard baking a photoresist pattern in accordance with the present invention.

FIG. 2 is a schematic view of an apparatus for hard baking a photoresist pattern in accordance with the present invention.

As shown in the drawing, there is installed a chamber 200 defining a heating space. A chuck 202, a support plate, for supporting a semiconductor substrate thereon is installed at a lower portion in the chamber 200.

A semiconductor substrate 20 is mounted on the upper surface of the chuck 202, and a photoresist pattern 22 is formed on the upper surface of the semiconductor substrate 20.

A cooling unit 204 is installed at the bottom surface of the chuck 202. The cooling unit 204 refers to a cooling water pipe line that circulates cooling water.

An infrared-ray lamp 210, a heating unit, is installed at the upper portion of the chamber 200.

A fly-eye lens 220, a unit for evenly distributing light, is installed at a lower portion of the infrared-ray lamp 210. The fly-eye lens is used for lighting apparatus or an optical apparatus to distribute light evenly. U.S. Pat. No. 4,884,869 presents a detailed explanation on a construction of the fly-eye lens, and U.S. Pat. No. 5,760,963 discloses a fly-eye lens-applied optical apparatus.

The fly-eye lens 220 includes a temperature-sensing unit 230.

The present invention combines the fly-eye lens, which has been used to distribute light evenly in an optical apparatus, and the infrared-ray lamp, which has been used as a heating unit for semiconductor substrate, to provide an apparatus for hard baking a photoresist pattern which is capable of evenly heating both the central portion and the marginal portion of the semiconductor substrate, and capable of easily controlling a temperature as well as having an excellent temperature control reaction characteristic.

In addition, since the cooling unit is installed at the lower portion of the chuck, in case that a temperature goes beyond a temperature set by the temperature sensing unit, the cooling unit cools the semiconductor substrate, thereby maintaining an appropriate temperature for the semiconductor substrate.

As so far described, the apparatus for hard baking a photoresist pattern in accordance with the present invention has the following effects.

That is, the hard baking apparatus is able to evenly heat both the central portion and the marginal portion of the semiconductor substrate.

Also, since it adopts direct heating method by means of the infrared-ray lamp, the temperature is easily controlled, and its excellent temperature control reaction characteristic contributes to improve a reliability of the fabricating process of a semiconductor device.

By using the apparatus for hard baking a photoresist pattern, a contact hole mask having an opening with a limit resolving size can be formed. Namely, the size of the opening of the contact hole can be minutely and finely controlled during the hard bake process of the photoresist pattern, allowing the formation of a semiconductor device with a fine pattern width.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. An apparatus for hard baking a photoresist pattern comprising:

a chamber;

a chuck installed at a lower portion in the chamber on which a semiconductor substrate is mounted;

a heating unit installed at an upper portion in the chamber;

a lens unit installed at a lower portion of the heating unit for evenly distributing light and uniformly heating the semiconductor substrate; and a cooling water pipeline installed at a surface of the chuck.

2. The apparatus according to claim 1, wherein the heating unit refers to an infrared-ray lamp.

3. The apparatus according to claim 1, wherein the unit for evenly distributing light refers to a fly-eye lens.

4. The apparatus according to claim 3, wherein a temperature sensing unit is additionally installed in the unit for evenly distributing light.

\* \* \* \* \*